United States Patent
Bass

(10) Patent No.: US 9,433,130 B2
(45) Date of Patent: Aug. 30, 2016

(54) COOLING DEVICE AND COOLING ARRANGEMENT INCLUDING COOLING DEVICE

(71) Applicant: HKR SEUFFER AUTOMOTIVE GMBH & CO. KG, Kupferzell (DE)

(72) Inventor: Wolfgang Bass, Adolzfurt (DE)

(73) Assignee: HKR SEUFFER AUTOMOTIVE GMBH & CO. KG, Kupferzell (DE)

( * ) Notice: Subject to any disclaimer, the term of this patent is extended or adjusted under 35 U.S.C. 154(b) by 0 days.

(21) Appl. No.: 14/638,304

(22) Filed: Mar. 4, 2015

(65) Prior Publication Data
US 2015/0257309 A1    Sep. 10, 2015

(30) Foreign Application Priority Data
Mar. 6, 2014   (DE) .................... 20 2014 002 060 U

(51) Int. Cl.
*H05K 7/20* (2006.01)
*G06F 1/20* (2006.01)

(52) U.S. Cl.
CPC ...... *H05K 7/20509* (2013.01); *H05K 7/20436* (2013.01); *H05K 7/20445* (2013.01)

(58) Field of Classification Search
CPC .......... H05K 7/20; H05K 7/204; H05K 7/14; H05K 7/20509; G06F 1/20; H01L 23/34; H01L 23/36; F28F 7/00; H01R 12/00; G01F 1/26
USPC ...................... 361/679.46, 679.54, 690, 694, 361/704–712, 714, 715, 719–724; 165/80.2, 80.3, 104.33, 185; 257/706, 257/713, 718, 719, 723; 174/15.1, 16.3, 174/252
See application file for complete search history.

(56) References Cited

U.S. PATENT DOCUMENTS

| | | | | |
|---|---|---|---|---|
| 4,254,447 A | * | 3/1981 | Griffis | H01L 23/3672 174/16.3 |
| 4,945,451 A | * | 7/1990 | Gohl | H05K 1/0209 165/185 |
| 6,351,385 B1 | * | 2/2002 | Featherstone, III | H01L 23/3672 165/185 |
| 6,696,643 B2 | * | 2/2004 | Takano | H05K 1/0206 174/520 |
| 6,821,816 B1 | * | 11/2004 | Lawlyes | H01L 21/563 257/E21.503 |
| 7,023,699 B2 | * | 4/2006 | Glovatsky | H05K 7/2049 165/185 |
| 7,064,963 B2 | * | 6/2006 | Oman | H01L 23/367 174/252 |
| 8,014,152 B2 | * | 9/2011 | Nishiuma | H05K 7/20481 165/80.2 |
| 2009/0161318 A1 | * | 6/2009 | Sanderson | H05K 1/0203 361/709 |
| 2010/0110641 A1 | * | 5/2010 | Okahashi | H05K 1/0203 361/720 |

FOREIGN PATENT DOCUMENTS

| | | |
|---|---|---|
| DE | 4332115 A1 | 3/1995 |
| DE | 10225993 A1 | 12/2003 |
| DE | 10127268 A1 | 4/2004 |

(Continued)

*Primary Examiner* — Michail V Datskovskiy
(74) *Attorney, Agent, or Firm* — Ware, Fressola, Maguire & Barber LLP

(57) ABSTRACT

The invention relates to a cooling device for heat-emitting components, wherein at least one component is arranged on a printed circuit board and wherein the cooling device includes a first cooling member and a second cooling member. The two cooling members are arranged on the printed circuit board adjacent to and at a predetermined distance from the at least one component on opposite sides of the component. The invention further relates to a cooling arrangement for cooling at least one heat-emitting component arranged on a printed circuit board, wherein use is made of the cooling device.

10 Claims, 8 Drawing Sheets

(56) References Cited

FOREIGN PATENT DOCUMENTS

| DE | 10343429 A1 | 4/2004 |
| DE | 202004003793 U1 | 5/2004 |
| DE | 102008019797 A1 | 10/2009 |
| DE | 102009022110 A1 | 2/2010 |
| DE | 102008042099 A1 | 3/2010 |
| EP | 0600590 A1 | 6/1994 |
| EP | 1091403 A2 | 4/2001 |
| EP | 1750302 A2 | 2/2007 |
| EP | 1930944 A2 | 6/2008 |

* cited by examiner

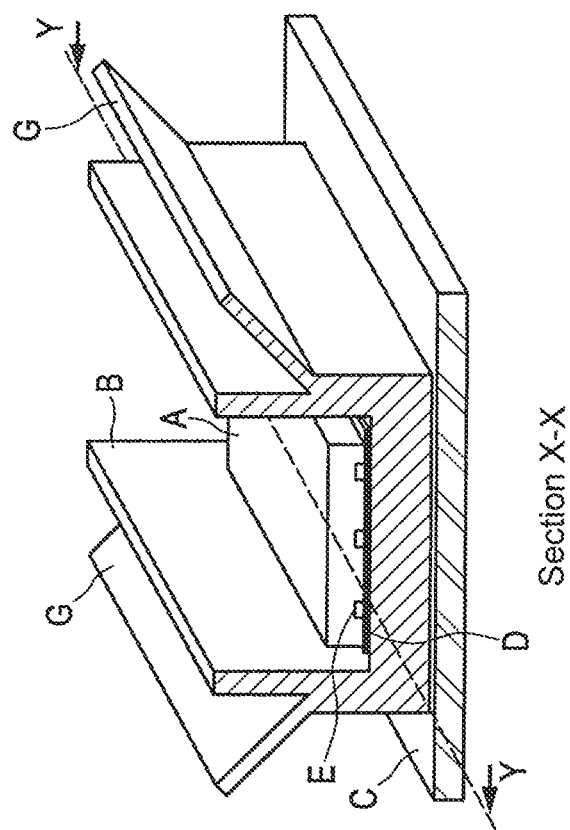
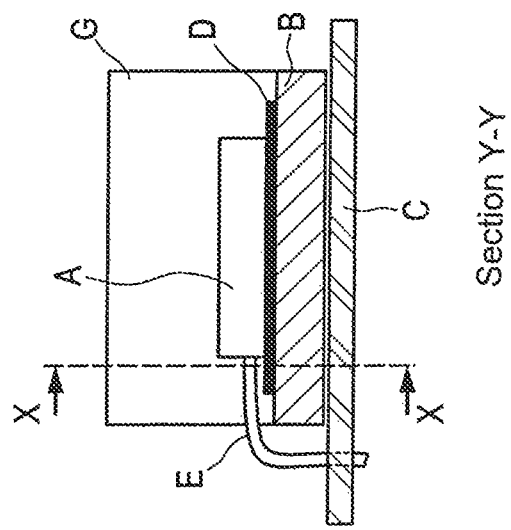
FIG. 8B
Section X-X
FIG. 8A
Section Y-Y
PRIOR ART

COOLING DEVICE AND COOLING ARRANGEMENT INCLUDING COOLING DEVICE

CROSS REFERENCE TO RELATED APPLICATION

This application claims priority under 35 USC §119 to Germany Patent Application No. 20 2014 002 060.4 filed on Mar. 6, 2014, which application is hereby incorporated by reference in its entirety.

TECHNICAL FIELD

The present invention relates to a cooling device for electric and electronic components and especially to a cooling device as part of a cooling arrangement, the cooling device being provided in addition.

BACKGROUND OF THE INVENTION

In electric and electronic circuits a plurality of different components is used for providing a particular function. In dependence on the type of the respective component and the load of the components in connection with the electric values of current and voltage, at least some of the components constitute heat sources of different thermal capacity and thus different heat transfer. Especially semiconductor components and specifically power transistors show particular electric dissipation losses which are dependent on the type and the operation and are not to be neglected so that partly considerable heating occurs. The heat must be dissipated during operation of the respective components so as to prevent inadmissible heating and, consequently, damage or destruction of the components.

In circuits for the control of electric motors for example signals clocked for power matching or power control of the respective electric motors are used, thereby the active components such as the transistors (power semiconductors) and electrolyte capacitors exhibiting increased power dissipation so that cooling is indispensable. For this purpose the components exhibiting respective power dissipation and thus emitting heat are cooled and are frequently mechanically and, resp., thermally connected to a so called heat sink.

A heat sink constitutes a means consisting of a proper heat-conducting material and increasing the surface required for the emission of heat so that the heat of the component to be cooled is absorbed and is efficiently emitted to the air, for example, by means of natural convection or with the aid of a ventilator. Also other coolants can be used, for instance in the form of liquid. It is essential that the active surface for the emission of heat of the component is increased and the heat is withdrawn from the component by the properly heat-conducting material of the heat sink. Heat sinks are generally made of metal such as copper or aluminum, wherein also the design of the surface influences the heat emission.

A basic and known arrangement of a component A to be cooled in connection with an arrangement on a heat sink B is shown in a simplified and schematic manner in FIG. 8. The component to be cooled can be a power transistor, for example.

In this case, on a printed circuit board C the heat sink B is arranged. The heat sink B is provided in thermal contact with the component A arranged on the heat sink B.

Preferably the component A can be arranged to be insulated against the heat sink B by means of an insulating layer D, wherein the insulating layer D is to be electrically non-conducting but adequately heat-conducting.

The component A can be electrically connected to the printed circuit board C by means of appropriate connecting elements E for providing the respective function.

FIG. 8A illustrates a sectional view along the sectional line Y-Y according to FIG. 8B (the component A is not shown in a cut view in this context) and FIG. 8B illustrates a sectional view along the line X-X according to FIG. 8A. The heat sink B includes full-surface branches G which are structured so that they increase the active surface for heat emission of the heat absorbed by the component A.

If power dissipation and thus heat occurs in the component A during operation, this heat is emitted to the heat sink B via the insulating layer D, and the heat sink B in turn emits the heat extensively to the environment via the branches G. In this manner the heating of the component A can be kept within reasonable limits so that the component A is prevented from being destroyed or damaged.

If more heat is to be removed due to higher power dissipation, a larger heat sink or, dependent on the heat to be removed, also active ventilation by means of a ventilator or another preferably fluid coolant is required.

In this context, the document EP 1 750 302 A1 discloses an electric component arrangement in which a plurality of substantially electronic components, which can be respective power components and constitute a heat source, on the one hand are retained in position by means of a spring comb made of metal and, on the other hand, can be cooled via the spring comb contacting the component. This cooling takes place in addition to the cooling of the respective components by means of a heat sink onto which the components are pressed by means of the spring comb. The entire arrangement is mounted in a closed casing in this form.

The document DE 102 25 993 A1 discloses a heat sink having a body and wherein a heat-emitting component is pressed onto the body by means of a mechanical means for providing a thermal contact. The mechanical means comprises a spring element which is attached to a pin by an aperture arranged therein and is held by means of the pin and at the same time contacts the component to be cooled and presses the same to the body. For applying the pressing force the mechanical element is attached to the pin in such way that, in connection with the aperture into which the pin protrudes, tilting occurs and thus a moment (force) can be exerted on the component. The heat of the component is emitted to the body by the thermal contact with the latter.

Finally the document EP 1 091 403 A2 discloses the arrangement of a heat sink, wherein the heat sink is structured in such manner that on a base plate a plurality of lamellas are arranged and the lamellas are aligned with each other in plural rows and in their longitudinal orientation so that an airflow required for cooling can pass through the plural rows of lamellas. The lamellas can be made of planar or curved elements and can have further bent areas for influencing a cooling airflow at the end distant from the base plate.

The afore-considered known devices of heat sinks or cooling arrangements for electric or electronic components are structured so that a compact design is hardly possible by the arrangement of at least one or more cooling devices in a small space within a casing. The afore-described arrangements require a particular size and, resp., a particular space in accordance with the respective configurations of the heat sinks so as to achieve sufficient cooling effect by natural or forced convection.

SUMMARY OF THE INVENTION

Therefore it is the object underlying the present invention to configure a cooling arrangement comprising a cooling device of the afore-mentioned type so that sufficient cooling effect can be achieved even with a compact design using minimum space inside a casing.

In accordance with the invention, this object is achieved by a cooling device and a cooling arrangement making use of the cooling device in accordance with the features of the enclosed claims.

The present invention thus relates to a cooling device for heat-emitting components, wherein at least one component is arranged on a printed circuit board and wherein the cooling device includes first and second heat sinks, and wherein the two heat sinks are arranged on the printed circuit board to be adjacent and at a predetermined distance from the at least one component on opposite sides of the component.

Moreover, the present invention relates to a cooling arrangement for cooling at least one heat-emitting component arranged on a printed circuit board, comprising a cooling unit forming a casing and including a heat sink and a cover, wherein in an assembled state of the casing the printed circuit board is arranged with the at least one component between the heat sink and the cover and the heat sink includes a contact area resting on the at least one component for forming thermal contact and in the area of the at least one component the cover includes a projecting portion adjacent to the printed circuit board on the side of the printed circuit board facing away from the at least one component, and comprising a cooling device according to the foregoing description.

By the cooling device according to the invention and, resp., the cooling arrangement according to the invention it is possible to even better cool heat-emitting components, as plural cooling options are provided so that a comprehensive heat removal is ensured, wherein simultaneously the entire cooling arrangement including the respective components to be cooled can have a compact design. Even in the case of arrangement in a casing of an apparatus, an at least sufficient cooling is ensured with small space available. The cooling device according to the present invention constitutes a supplementary cooling option for the heat-emitting components and is provided and configured independently of the existing cooling options.

The cooling device according to the invention thus is adapted to assist comprehensive cooling either alone in the case of low cooling demand or additionally in connection with further cooling concepts in the case of increased cooling demand. Moreover, the cooling device arranged adjacent to the components to be cooled can also serve for further purposes, especially it can also be used for conducting current to a predetermined extent. Furthermore, it can also serve as a means for mechanically stabilizing a printed circuit board on which both the components emitting heat and to be cooled and the cooling device (and further components, where necessary) are arranged. The printed circuit board can be mounted in a casing so that, in combination with the entire cooling arrangement, a very compact design with simultaneously very comprehensive cooling can be achieved.

Further features of the present invention are described in the dependent claims.

In the cooling device the cooling members may include segments each of which is arranged in parallel to the corresponding sides of the at least one component and is adapted to extend away from the printed circuit board.

A cooling unit can be arranged on the at least one component and the cooling unit may include a contact area resting on the at least one component for thermal contact, and wherein the cooling members of the cooling device extend away from the printed circuit board over the at least one component adjacent to the contact area and may be spaced apart therefrom.

In the cooling device a heat conducting material can be introduced in a space between the respective cooling member and the contact area of the cooling unit for forming thermal coupling between the respective cooling member and the contact area of the cooling unit.

In the case of plural components the cooling members can be arranged adjacent to each component and a segment of the respective cooling member can be arranged adjacent to each component.

In the cooling device the plural components may be arranged in a straight line or in any curved line and the cooling members of the cooling device may follow the path of the arrangement of the plural components, wherein a segment of the respective cooling member may be arranged adjacent to each component on different sides thereof.

Furthermore, in the cooling arrangement in the case of plural components the respective contact area of the heat sink and the projecting portion of the cover can follow the arrangement of the components on the printed circuit board, wherein the contact area of the heat sink can be adjacent to at least some or all components.

In the cooling arrangement the cooling members of the cooling device can extend away from the printed circuit board and can extend in lateral vicinity of and at a predetermined distance from the contact area of the heat sink, and the space between the heat sink and the cover may entirely or at least partly include heat conducting material. Moreover the cooling members of the cooling device can be mechanically and electrically connected to the printed circuit board and serve as electric conductors.

BRIEF DESCRIPTION OF THE DRAWINGS

Hereinafter the present invention will be described in detail by way of embodiments with reference to the drawings, in which.

DETAILED DESCRIPTION

Hereinafter the present invention will be described by way of an embodiment with reference to the FIGS. 1 and 2 as regards the basic structure of the present invention.

Figure 1:
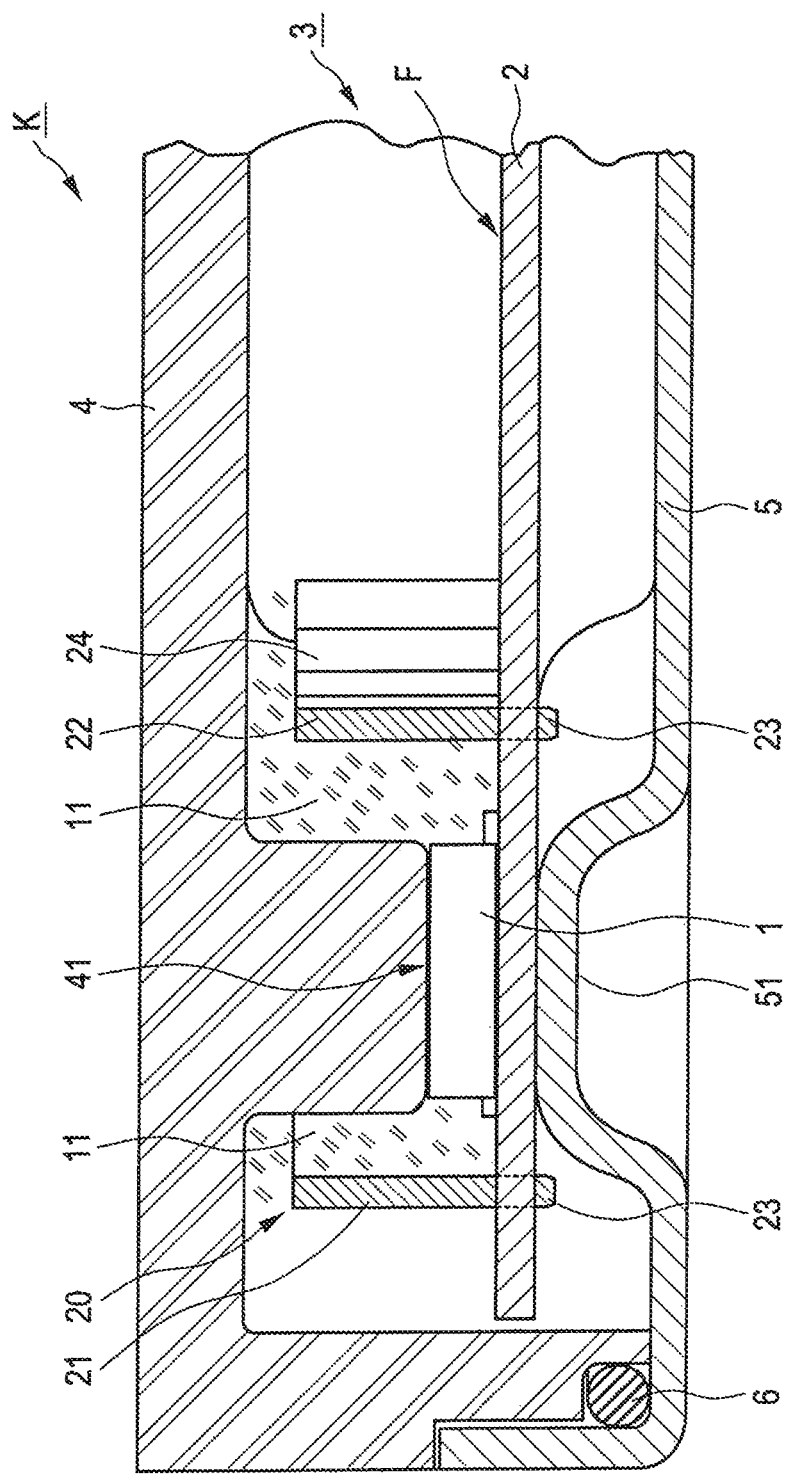
FIG. 1 shows a partial sectional view of the cooling arrangement including the cooling device in accordance with an embodiment of the present invention.

FIG. 1 shows a partial sectional view of the arrangement of a heat-emitting component 1 in connection with the cooling arrangement K according to the invention.

The heat-emitting component 1, hereinafter simply referred to as component 1, can be a power semiconductor component such as a transistor or else, having a different outer shape, an electrolyte capacitor. The invention is neither fixed to a particular component nor to a particular outer shape of such component 1. Rather, it can be used for any type of components which emit heat during operation or at least in specific operating conditions due to power dissipation.

The component 1 is arranged on a printed circuit board 2 which can include, apart from the component 1 shown for the purpose of illustration of the present invention, further components of different type and size in different distribution on the printed circuit board 2. In this context, FIG. 2 illustrates the printed circuit board 2 which has an approximately circular structure, for example. The present invention is not fixed to the shape and the size of the printed circuit board 2, however, but can be applied to printed circuit boards of different type, size and shape. For receiving further components the printed circuit board 2 includes a functional area F in which the further components can be arranged in any way. The components arranged in the functional area F are not specified in detail and are dependent on a function to be obtained of the respective circuit arrangement.

Figure 2:
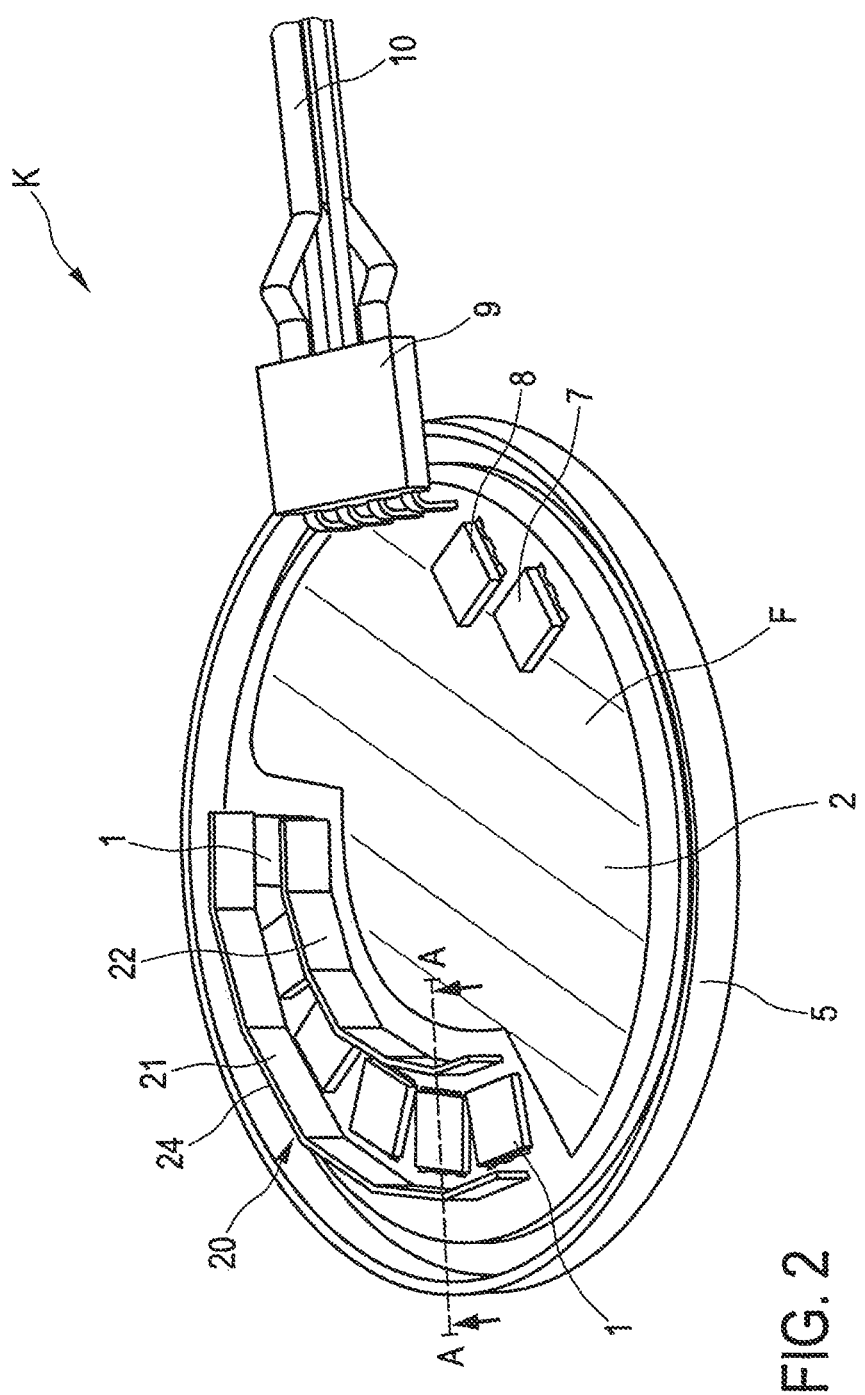
FIG. 2 shows a perspective view of part of the cooling arrangement comprising the cooling device and the heat-emitting components arranged on a printed circuit board.

In accordance with the FIGS. 1 and 2, the printed circuit board 2 is inserted in a casing 3 which consists, for example, of a heat sink 4 (at the top of FIG. 1) and a cover 5 (at the bottom of FIG. 1). When the casing 3 is assembled and especially the heat sink 4 is attached to the cover 5, between the two parts a sealing means 6 can be arranged which may be in the form of a sealing mass or a seal ring formed of elastic material, for example.

In FIGS. 1 and 2 the printed circuit board 2 is inserted in the cover 5 provided below the printed circuit board 2 in the representation in FIG. 1 and further Figures. The heat sink 4 is arranged above the printed circuit board 2 (not shown in FIG. 2 for better illustration) so that the printed circuit board 2 is received and safely held between the heat sink 4 and the cover 5.

FIG. 1 shows the component 1 on the printed circuit board 2, wherein the component 1 rests substantially flush on the printed circuit board 2 and can be a so called surface mounted device (SMD) for example (without being limited thereto). The component can have corresponding connecting elements (usually adapted to be soldered) for this purpose.

After attaching the heat sink 4 to the cover 5 and thus also to the printed circuit board 2 as well as to the component 1 to the predetermined extent, the heat sink 4 contacts the component 1 so that proper thermal connection exists between the component 1 and the heat sink 4, wherein heat formed in the component 1 can be transferred to the heat sink 4 with low heat transmission resistances. For this purpose, the heat sink 4 comprises, in the area adjacent to the component 1 and above the same, a contact area 41 projecting downwards vis-à-vis the further structure of the heat sink 4 (in the Figure) and being formed so that, as regards its dimension, it is aligned to the component 1 to be thermally contacted and, when the heat sink 4 is completely attached to the cover 5, contacts the full surface of the component 1 with gentle pressure to ensure good heat conduction.

In the same way the cover 5 comprises a projecting portion 51 which projects upwards also compared to the further formation of the cover 5 to a predetermined extent, wherein the projecting portion 51 of the cover 5 is formed below the component 1 and, as regards its dimension, thus is equally largely adapted to the size (dimensions, extension) of the component 1.

As a result, the component 1 is thus provided on the printed circuit board 2 and the component 1 and the printed circuit board 2 are arranged between the contact area 41 of the heat sink 4 and the projecting portion 41 of the cover 5, the projecting portion 51 of the cover 5 contacting the printed circuit board 2 from below at a predetermined low pressure. This is shown in the sectional view of FIG. 1. In the area of pressing the contact area 41 onto the component 1 (from above) and of pressing the projecting portion 51 onto the printed circuit board 2 (from below) no connecting leads are provided. According to FIG. 1, the component 1 is connected to the printed circuit board 2 and corresponding conductor paths outside these pressing areas. For ensuring proper heat conduction on the one hand and electric insulation on the other hand, between the contact area 41 and the component 1 as well as between the projecting portion 51 and the printed circuit board 2 thin insulating layers may be arranged which exhibit good thermal conductivity but are electrically insulating. In this way also in the long run efficient electric insulation with simultaneously proper heat conduction is guaranteed.

In this context, FIG. 2 shows in a perspective representation the printed circuit board 2, wherein at least one component 1 and e.g. 6 components 1 are shown having an identical or similar structure and also equal dimensions, for example. These components are arranged in the left area of the printed circuit board 2 according to FIG. 2. Inside the functional area F further components such as components 7 or 8 can be arranged. These further components 7 and 8, too, can be heat-emitting components. Thus also in the area of these further components 7 and 8 the cover 5 may have another projecting portion, and equally the heat sink 4 may include another contact area 42 in a similar way and in dependence on the position of the further components 7 or 8 on the printed circuit board 2. Such further contact area 42 is illustrated, for example, in the lower part of FIG. 5 described below.

Figure 3:
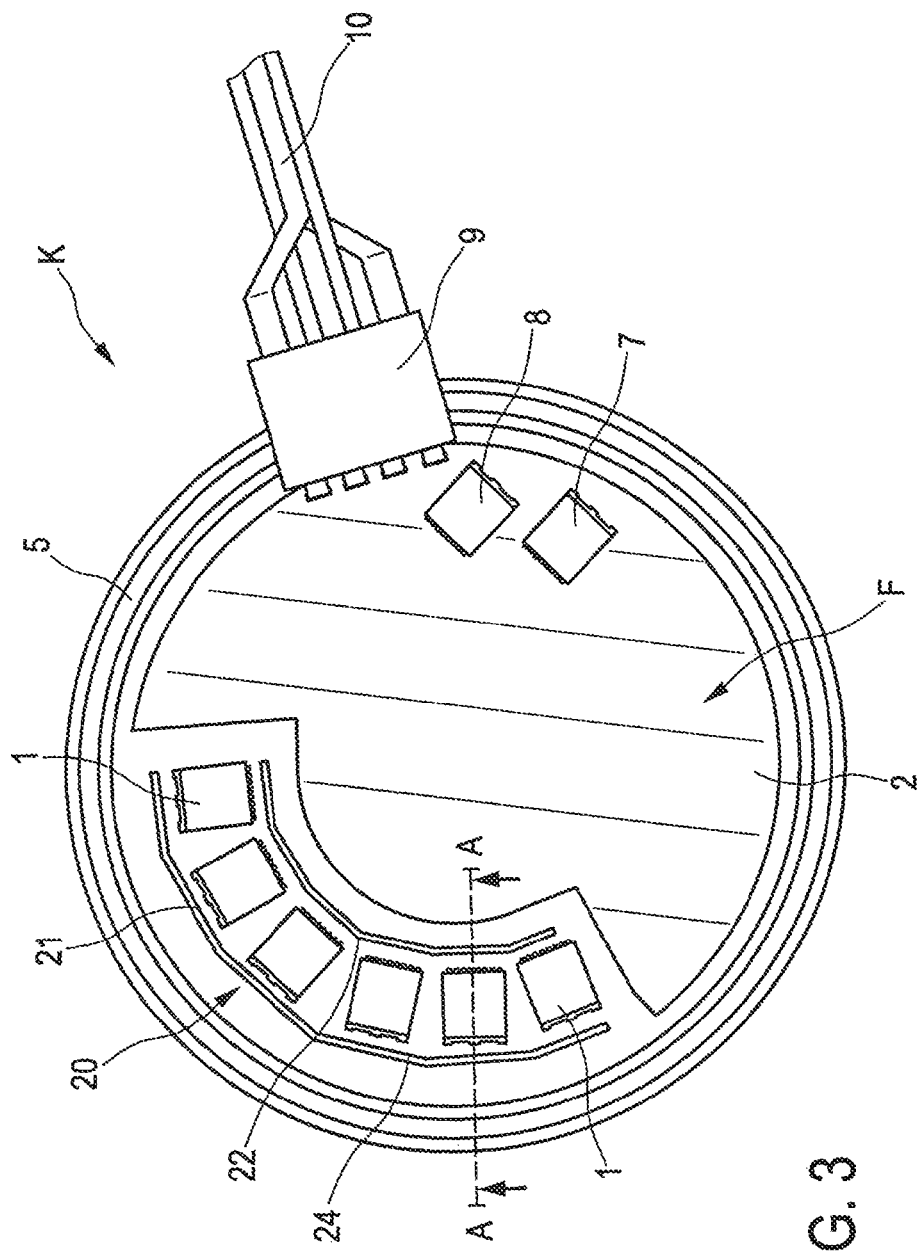
FIG. 3 is a top view onto the printed circuit board according to FIG. 2 comprising the cooling device and the heat-emitting components.

FIG. 3 shows a top view of the arrangement according to FIG. 2, in the left area the components 1 (identical or similar heat-emitting components) being arranged, while by way of example in the right area of FIG. 3 the further (similar or different) components 7 and 8 are arranged.

For completing the entire arrangement, in FIGS. 2 and 3 a connecting means 9 of the printed circuit board 2 is shown which, on the one hand, is connected to the printed circuit board 2 via connecting elements and, on the other hand, is connected to leads 10 via which electric power and control signals are supplied to the printed circuit board 5 and, resp., to the circuit arrangement arranged thereon. The connecting means 9 can be tightly connected to the printed circuit board 2 or can be in the form of a plug connection. Furthermore, in the representation of FIGS. 2 and 3 the heat sink 4 (cooling unit) is omitted so that the arrangement and the position of the at least one component 1 or the plural components 1 is visible on the printed circuit board 2.

The circuit arrangement as it is formed on the printed circuit board 2, for example, which includes at least the electric components 1 and the further components 7 and 8 can serve e.g. for the control of electric devices in automotive vehicles, household appliances or machines and can be used, for example, with an appropriate dimensioning of the casing 3 as control means for electric motors in an automotive vehicle. For this purpose, the casing 3 in connection with the heat sink 4 and the cover 5 can be assembled to be fluid-tight (in connection with the sealing means 6) so that moisture or pollution is effectively prevented from penetrating the casing 3 and especially the printed circuit board 2. This results in a long life of the entire arrangement.

In the representation according to FIG. 1 the component 1, on the one hand, is provided on the printed circuit board 2 and this arrangement is provided between the contact area 41 of the heat sink 4 and the projecting portion 51 of the cover 5. Heat can be transferred to the respective part of the casing 3 and can be absorbed and distributed by the respective component parts both via the contact area 41 and the projecting portion 51. The heat sink 4 and the cover 5 as parts of the casing 3 thus constitute cooling units which independently of each other but jointly remove and distribute heat from the component 1. The cooling units in the form of the heat sink 4 and the cover 5 constitute part of the cooling arrangement K.

The cooling arrangement K moreover includes a cooling device 20 described in detail hereinafter in conjunction with FIGS. 1 to 4.

According to the representation in FIG. 1, the component 1 arranged on the printed circuit board 2 is provided together with the printed circuit board 2 between the heat sink 4 and the cover 5, and especially between the contact area 41 of the heat sink 4 and the projecting portion 51 of the cover 5. The corresponding taps for heat formed in the component 1 are thus realized directly above the component 1 or below the printed circuit board 2 in the area in which the component 1 is arranged on the opposite side (upper side in the Figures). The cooling device 20 comprises first and second cooling members 21 and 22, each being arranged adjacent to the heat emitting components and here adjacent to the at least one component 1 or to the (plural) components 1 on different sides thereof (i.e. on opposite sides of the at least one component 1) and being fastened to the printed circuit board 2. The two cooling members 21 and 22 extend next to and at a predetermined distance from the component 1 and extend from the printed circuit board 2 upwards in the Figures and exceed the height of the (at least one) component 1 so that the two cooling members 21 and 22 extend, equally at a predetermined distance, next to the contact area 41 of the heat sink 4 without contacting the heat sink 4.

In the representation and according to FIGS. 2 and 3, the plural components 1 are arranged between the afore-described cooling members 21 and 22 of the cooling device 20, the arrangement being performed in a curve with respect to the fact that in this embodiment the printed circuit board 2 has approximately the shape of a circular area in adaptation to the approximately circular casing 3 which in turn is adapted to the respective application. The invention is not restricted to the arrangement of the components 1 corresponding to part of an (at least approximate) circular arc, the plural components 1 rather can be also provided in the form of any other arrangements on the printed circuit board 2. The further description is connected to the illustration according to FIGS. 2 and 3 in which the plural components 1 are arranged along part of a circular arc.

The arrangement and the configuration of the cooling device 20 and especially of the first and second cooling members 21 and 22 are also related to the respective selected arrangement of the components 1. The respective cooling members 22 and 21 preferably but not necessarily formed in one piece follow the arrangement of the plural components 1 in the form of a traverse and thus extend at the predetermined distance adjacent to the components 1, wherein the shape of the first and second cooling members 21 and 22 shown in FIGS. 2 and 3 is resulting. For the purpose of illustration of the arrangement of the cooling members 21 and 22, the latter are shown without any further component parts of the cooling arrangement K in FIG. 4. The traverse substantially corresponds to the number of the plural components 1 arranged between the first and second cooling members 21 and 22.

The two cooling members 21 and 22 of the cooling device 20 include projections 23 by means of which the heat sinks 21 and 22 can be fastened to the printed circuit board 2. The connection of the two cooling members 21 and 22 to the printed circuit board 2 at least relates to a mechanical connection (fastening) and preferably to a mechanical and electric connection. The electric connection thus exists between the two cooling members 21 and 22 and conductor paths on the printed circuit board 2. As regards the mechanical fastening and preferred electric connection, the projections 23 protrude into corresponding apertures of the printed circuit board 2 so that the cooling members 21 and 22 extend upwards starting from the printed circuit board 2 and approximately perpendicularly to the surface of the printed circuit board 2 (e.g. in FIGS. 1, 2, 6 and 7). The cooling members 21 and 22 can be soldered to the printed circuit board 2 (for forming an electric and mechanical connection) or can be pressed into corresponding apertures in the printed circuit board 2. The soldering options comprise manual soldering, wave soldering (flow soldering), selective soldering or reflow soldering.

As a result, the two cooling members 21 and 22 on the one hand extend by part of their extension length next to the component 1 and at a predetermined distance therefrom, and by the further part of the extension length next to the contact area 41 and equally at a predetermined distance therefrom. Said distances relate to a plane in parallel to the plane of the printed circuit board 2 and substantially perpendicular to the extension direction of the cooling members 21 and 22. The respective distances between the cooling members 21 and 22 and the at least one component 1 or the plural components 1 can be equal or else different on both sides of the component 1 (or the plural components 1). This is equally applicable to the distances of the cooling members 21 and 22 on part of their length of extension to the contact area 41.

Figure 4:
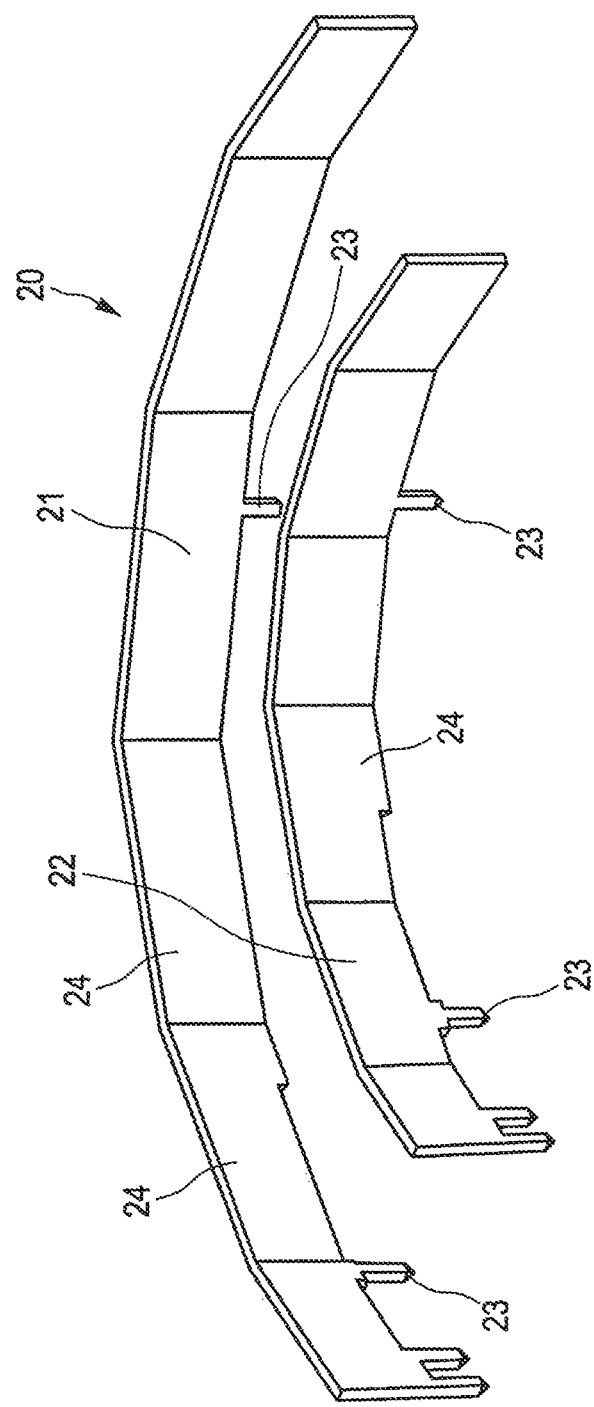
FIG. 4 is a representation of the cooling device comprising the cooling members, further components of the entire arrangement being omitted for better illustration of the cooling device.

According to the representation in FIGS. 2 to 4, the two cooling members 21 and 22 are preferably formed integrally and in the form of a traverse, wherein the number of segments 24 forming a respective traverse of the corresponding heat sink 21 and 22 is arranged adjacent to a component 1 in each case. Due to the curved arrangement of the components 1, the respective segments 24 of the two cooling members 21 and 22 are different as to their dimensions, wherein equally different dimensions may result dependent on other arrangements of the components 1 and thus a different design of the respective cooling members 21 and 22.

Figure 5:
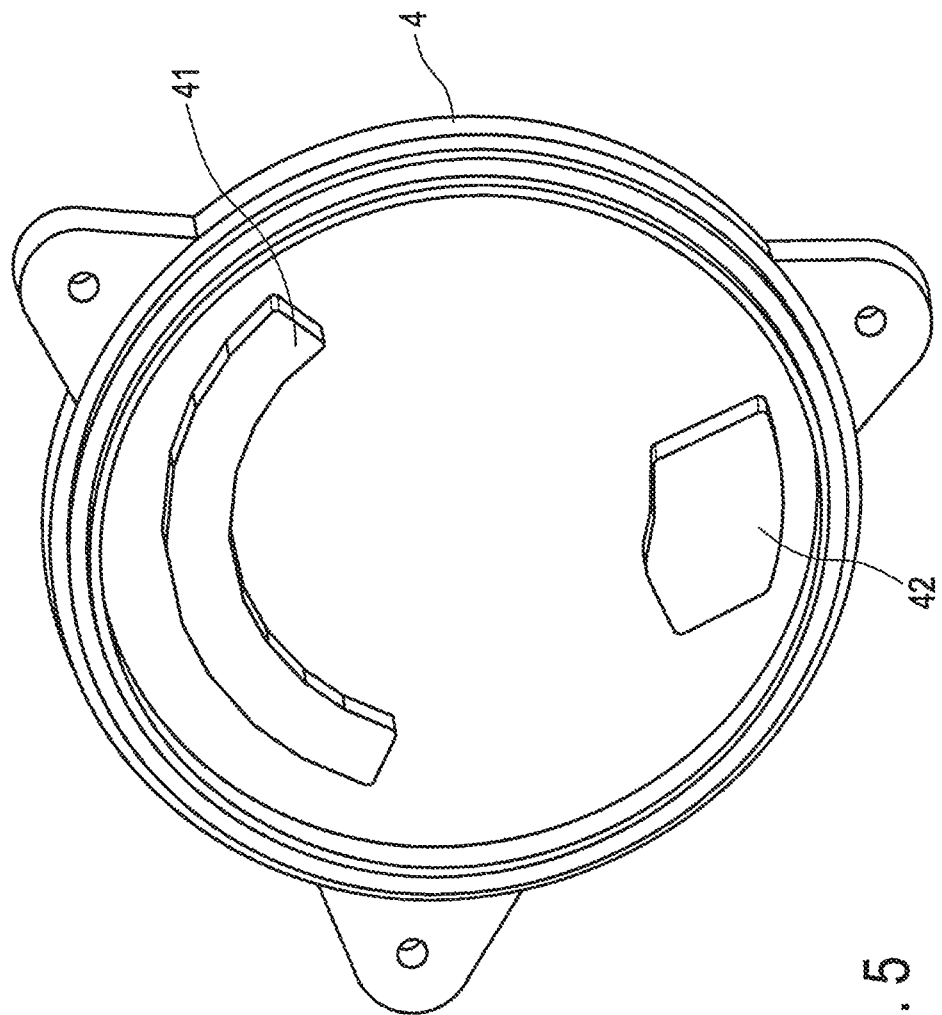
FIG. 5 is a perspective representation of a heat sink of the cooling arrangement according to FIG. 1 as it can be attached onto the arrangement illustrated in FIG. 2.

When the heat sink 4 according to FIG. 5 is attached to the cover 5 and the printed circuit board 2 according to FIG. 2 so that the contact area 41, which is likewise formed exactly curved corresponding to the curved arrangement of the components 1 or in the form of a more or less distinct traverse, rests on the plural components 1 and is provided inside the two cooling members 21 and 22, the further contact area 42 equally rests on the further components 7 and 8 with low pressure so that all components 1 or 7 and 8 exhibit good thermal connection to the heat sink 4 and thus appropriate thermal conduction is ensured from the components 1, 7 and 8 to the heat sink 4. The heat sink 4 at no point contacts the cooling members 21 and 22 of the cooling device 20, but is rather spaced apart from these components and thus is safely electrically insulated.

In connection with the representation in FIG. 1 it was stated in the foregoing that the respective projecting portion 51 or the contact area 41 can rest directly on the lower side of the printed circuit board 2 or the upper side of the component 1. Preferably a thin insulating layer of heat-conducting material is provided, however, so that electric insulation can be provided. Furthermore, by the insulating layer also a resilient support can be obtained which is capable of compensating tolerances and variations of the dimensions of the components involved due to heating and cooling and of dampening possible vibrations during operation. This arrangement equally ensures tight holding of the respective components 1 (as well as of the components 7 and 8).

It was equally stated in the foregoing that the two cooling members 21 and 22 partly extend next to the contact area 41 of the heat sink 4 at a predetermined distance therefrom. According to FIG. 1, the space between the cooling members 21 and 22, on the one hand, and the component 1 and the contact area 41 of the heat sink 2, on the other hand, is equally filled completely or at least partly with an elastic and electrically insulating heat conducting material 11. The heat conducting material 11 contacts the full surface of the cooling members 21 and 22 as well as the contact area 41 of the heat sink 4 and can be separately introduced, or it can be introduced to the space between the afore-stated components (1, 2, 5, 21, 22, 51) by means of a casting operation.

By means of the heat conducting material 11 especially between the respective cooling members 21 and 22 and the projecting contact area 41 of the heat sink 4 a thermal connection is thus made so that heat can be transferred from the contact area 41 to the cooling members 21 and 22 or from the cooling members 21 and 22 to the contact area 41. The heat conducting material 11 thus establishes a comprehensive thermally conducting but electrically insulating connection and can be restricted to the space inside the two cooling members 21 and 22 of the cooling device 20, or also further spaces between the printed circuit board 2 and the heat sink 4 and the printed circuit board 2 and the cover 5 can be filled at least partly or completely with further heat conducting material 12 so as to improve the dissipation of heat formed in the component 1 so as to dampen vibrations due to external influences upon application in automotive vehicles or other vibrating machines and to back corrosion protection inside the casing 3. The further heat conducting material 12 outside the space between the cooling members 21 and 22 will be described hereinafter in connection with FIG. 7. The heat conducting material 11 in the space between the two cooling members 21 and 22 can be equal to the further heat conducting material 12 in the other spaces or else different dependent on the heat quantity and temperature load to be expected and to be transferred.

The heat conducting material 11 can be introduced in the form of an elastic mass, can be injected or can be introduced in the form of a mat or pad, wherein in the case of a mat or pad these components are adapted, in terms of their dimensions, to the spaces to be filled so that an at least partial surface contact with the cooling members 21 and 22 and the contact area 41 is ensured. The respective pads or mats of the heat conducting material 11 are selected to be slightly larger than required by the space to be filled so that they are adjacent to the respective components with slight pressure.

The cooling arrangement K thus comprises the cooling units in the form of the heat sink 4 and the cover 5 for directly cooling the component 1 (or a larger number of those components 1) arranged on the printed circuit board 2 and further comprises the two cooling members 21 and 22 in the afore-described arrangement and with the thermal coupling of the cooling members 21 and 22 to the heat sink 4 via the heat conducting material 11. Furthermore, also the further heat conducting material 12 can be arranged in the space between the cooling members 21 and 22 and the heat sink 4 outside the interstice between the cooling members 21 and 22.

Figure 6:
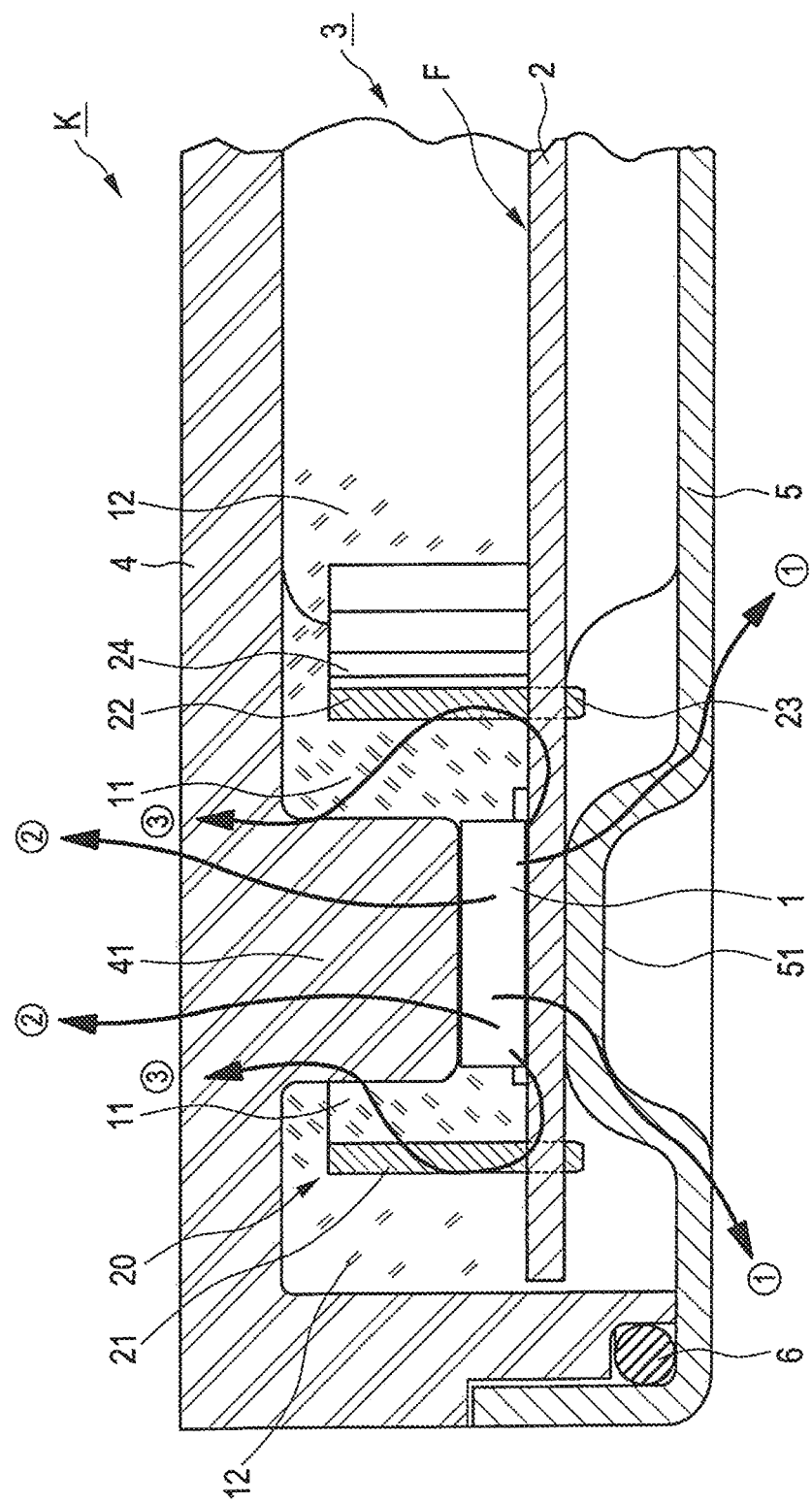
FIG. 6 shows a partial sectional view corresponding to the representation in FIG. 1, wherein different cooling paths of the cooling concept according to the invention are illustrated.

In conjunction with the afore-described cooling arrangement K the paths of heat conduction shown in FIG. 6, and especially the paths of dissipation of the heat from the heat-generating component 1 to the heat sink 4 and the cover 5 for further distribution and emission of the heat to the outside, which is preferably backed by a flow of cooling medium not shown (for example a cooling airflow in connection with a ventilator).

In accordance with FIG. 6, a first path W1 of the heat conduction (cooling path) exists from the component 1 via the printed circuit board 2 to the projecting part 51 of the cover 5. The first heat conducting path substantially extends in the properly heat-conducting material of the cover 5 and can be assisted by an electrically insulating heat conducting material not shown in the Figures in the pertaining cavities between the cover 5 and the printed circuit board 2.

A second path W2 of the heat conduction (cooling path) is formed between the component 1 and the contact area 41 of the heat sink 4, the heat being transferred directly from the at least one component 1 or the plural components 1 (possibly by a thin insulating layer of a heat conducting material between the contact area 41 and the component 1) to the contact area 41 and thus to the heat sink 4 for transmission and distribution of the heat.

The first and second paths W1 and W2 of heat conduction (first and second cooling paths) are thus provided by the cooling units (heat sink 4 and cover 5) of the cooling arrangement K.

FIG. 6 illustrates a third path W3 of heat conduction (third cooling path) extending from the component 1 to the two cooling members 21 and 22 adjacent to the component 1, wherein the heat generated by the at least one component 1 is transferred to the two cooling members 21 and 22. By means of the heat conducting material 11 between the cooling members 21 and 22 and the contact area 41 a thermal coupling (heat conducting bridge) is formed between the cooling members 21 and 22 and the heat sink 4 so that the heat absorbed by the cooling members 21 and 22 can equally be transferred to the heat sink by means of the heat conducting material 11 via the sides of the contact area 41. An additional heat distribution of the heat emitted by the at least one component 1 or the plural components 1 is obtained by the cooling members 21 and 22 of the cooling device 20.

In this way, in addition to the first and second paths W1 and W2 of the heat conduction a third path W3 is formed for the dissipation of the heat generated in the at least one component 1 by the cooling arrangement K according to the invention so that the heat dissipation and thus the efficient cooling of the component 1 (or the plural components 1) are improved. By introducing the heat conducting material 11 between the cooling members 21 and 22 and the contact area 41 an additional heat transfer to the heat sink 4 can be formed, and in total and additionally the mechanical stability and the vibration resistance of the cooling arrangement K including the printed circuit board 2 and the components arranged thereon (for example 1, 7 and 8) is efficiently improved. Likewise the corrosion protection is increased, in particular when in further spaces also an electrically insulating heat conducting material (for example in the form of the further heat conducting material 12) is introduced completely or at least partially and prevents pollution of the components (e.g. 1, 7 and 8 and others) on the printed circuit board 2.

Efficient cooling of the heat-emitting components 1 (or other components) is ensured by means of the heat conducting paths which are parallel and partly independent of each other (cooling paths) W1, W2 and W3 so that also in the case of tolerances of the components involved and thus possible temporal incomplete contact of the contact area 41 or of the projecting portion 51 with the respective component 1 and the printed circuit board 2 sufficient heat dissipation via one of the remaining paths W1, W2 or W3 for heat conduction is still possible. Preferably an optimized heat distribution is obtained by the different heat conducting paths W1, W2 and W3 of different runs so that sufficient and safe cooling of the components 1 is guaranteed even with a strongly varying heat generation by the components 1 and thus temporary stronger or less heating. The heat absorption and thus the heat capacity of the entire cooling arrangement K is increased without any further components or external cooling members being required.

In general, the heat conducting materials such as the heat conducting material 11 are made of a substance introduced during assembly of the afore-described components. The material of the heat sink 4 is preferably but not necessarily made of metal such as aluminum (aluminum die casting) or steel or copper. The cover 5 can equally be made of aluminum, steel or copper. In this manner, sufficient dissipation of the heat from the components 1 and occasionally from further components in the functional area F of the printed circuit board 2 is obtained so that also local heat pockets on the printed circuit board 2 including possibly inadmissible heating of the respective components 1 (also 7, 8) can be avoided.

In the afore-described FIGS. 2 to 5 the two cooling members 21 and 22 are shown in curved form or in the form of a traverse. This is required for adaptation to the components 1 arranged in curved shape in the present example. When the components 1 are arranged, for example, along a straight or curved line or in any other arrangement and also partly in an arc, the cooling members 21 and 22 follow the respective arrangement of the components 1 and, where necessary, also by a traverse having respective segments 24.

Hence the present invention is not restricted to the curved arrangement of the cooling members 21 and 22 according to the representation in FIGS. 2 to 4; rather the cooling members 21 and 22 may also exhibit shapes which considerably deviate therefrom. In any case the contact area 41 of the heat sink 4 shown in FIG. 5 is formed in such manner that it follows the arrangement of the components 1, either curved or in a traverse, wherein dependent on the demand part of the components 1 or all components 1 in the arrangement are contacted by the contact area 41 so that a safe thermal connection is established between the respective components 1 and the contact area 41 of the heat sink 4. The contact area 41 of the heat sink 4 can also follow the arrangement of the components 1 with interruptions, if individual components of the arrangement require no cooling.

Irrespective thereof, further contact areas 42 can be formed for equally heat-emitting further components such as the further components 7 and 8.

In the afore-described FIGS. 1 to 3 the spatial arrangement of the cooling members 21 and 22 was illustrated and contemplated. By arranging the cooling members 21 and 22 adjacent to the at least one component 1 or to the plurality of components 1 the cooling members 21 and 22 are also incorporated in the circuit arrangement and serve especially as electric conductors. Hence currents flow through the cooling members 21 and 22 in connection with the operation of the components 1. The cooling members 21 and 22 preferably made of metal thus constitute equally good electric conductors so that a sufficient conductor cross-section is available also for higher currents also by reason of a relatively large conductor cross-section according to the dimensions of the cooling members 21 and 22 for efficient dissipation of the heat of the components 1 in accordance with the third cooling path W3. The electric resistances of the cooling members 21 and 22 therefore are relatively low so that merely less Joule heat is formed in the cooling members 21 and 22.

Figure 7:
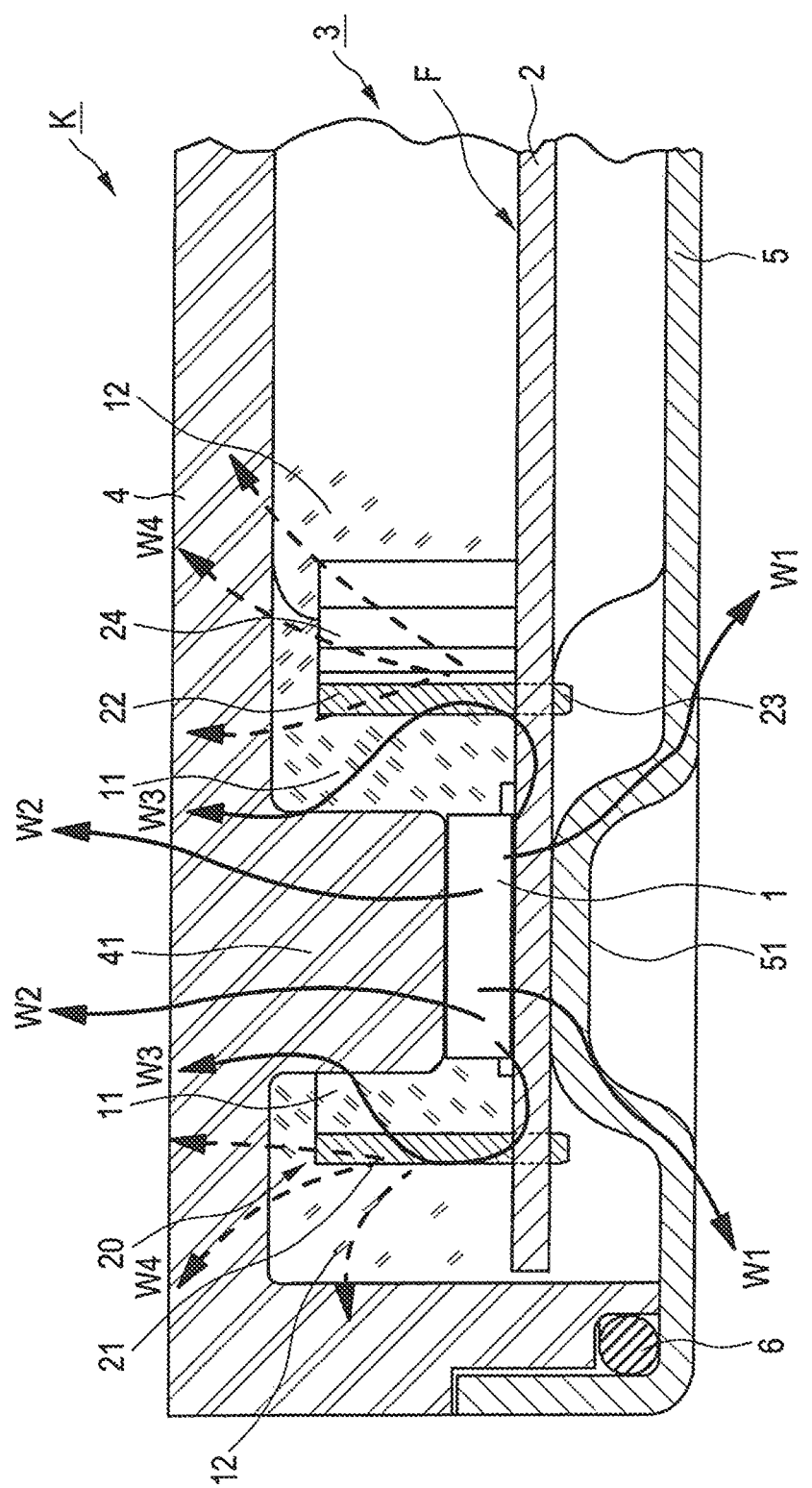
FIG. 7 shows a partial sectional view corresponding to the representation in FIG. 1, wherein different further cooling paths of the cooling concept according to the invention are illustrated in addition to the illustration in FIG. 6, and FIGS. 8A and 8B show a schematic and simplified representation of a heat-emitting component on a heat sink according to prior art in conjunction with sectional representations.

In this context, FIG. 7 shows the cooling paths W1 to W3 stated in FIG. 6 as well as, in addition, a fourth path W4 for heat conduction (cooling path) which also relates to the heat conduction of the Joule heat generated in the cooling members 21 and 22. In addition to the heat conducting material 11 in spaces between the cooling members 21 and 22 and the components and, resp., the contact area 41, in the spaces outside the cooling members 21 and 22, i.e. between a respective cooling member 21 or 22 and the heat sink 4, the already afore-mentioned further heat conducting material 12 is introduced which is similar to or different from the heat conducting material 11. By introducing the further heat conducting material 12 to the respective spaces according to the representation in FIG. 7, the fourth cooling path W4 is formed in addition and partly in parallel to the third cooling path W3, wherein the third and fourth cooling paths W3 and W4 are independent of each other. According to the representation in FIG. 7, the fourth cooling path W4 extends from the respective cooling member 21 or 22 to the heat sink 4 arranged there above (in the Figure) via the further heat conducting material 12.

The use of the cooling members 21 and 22 for conduction offers the advantage of substantially smaller electric resistance as compared to conductor paths on the printed circuit board 2 having a considerably smaller conductor cross-section and thus also less Joule heat. Moreover, the dissipation of the Joule heat generated in the cooling members 21 and 22 is improved compared to dissipation of Joule heat from corresponding conductor paths on the printed circuit board 2. The electric conductors in the form of the cooling members 21 and 22 thus can be properly incorporated in the heat management of the cooling arrangement K so that, on the one hand, the cooling members 21 and 22 improve dissipation of the heat of the components 1 and, on the other hand, the heat generated in the cooling members 21 and 22 themselves can be easily dissipated by electric currents via the heat sink 4. The different, partially parallel and complementary cooling paths W1 to W4 thus constitute extremely short cooling paths optimized regarding the components involved which improve the thermal (and additionally mechanical) stability of the entire arrangement. The heat conducting materials 11 and 12 form an electrically insulating heat conducting bridge for the respective components between which they are disposed.

The thermal conduction (thermal distribution) by means of the third and fourth cooling paths W3 and W4 is independent of the size of the heat-generating element (for example component 1) in the height between the printed circuit board 2 and the heat sink 4. The improved cooling effect is obtained irrespective of whether the at least one component 1 (or the plural components 1) is/are a component having larger or smaller dimensions. Furthermore, by a change of the expansion or extension of the cooling members 21 and 22 in height between the printed circuit board 2 and the heat sink 2 a heat-emitting surface can be increased, especially in connection with an increase in the extension length of the cooling members 21 and 22 starting from the printed circuit board 2 and, resp., the surface of the heat sinks 21 and 22 adjacent to the contact area 41 of the heat sink 4 without the base area of the printed circuit board 2 and thus the dimensions of the entire arrangement having to be increased. In general, the heat transfer is approximately proportional to the provided transfer surfaces, i.e. the surfaces of the components involved which are thermally interconnected by means of the appropriate heat-conducting material 11 and 12. With the heat-conducting materials 11 and 12 introduced to the cooling arrangement K the entire arrangement including the casing 3 exhibits an adequate thermal capacity so that during operation of the circuit on the printed circuit board 2 a relatively stable temperature with minor variations and thus low variations of the electric characteristics of all components is provided.

Thus the cooling members 21 and 22 can serve, on the one hand, as heat conductors and provide thermal conduction corresponding to the third cooling path W3 and, on the other hand, the cooling members 21 and 22 can also serve for electric conduction so that in connection with the third cooling path W3 the heat generated due to the currents in the cooling members 21 and 22 can be dissipated and distributed in an equally simple and safe manner. The Joule heat generated in the cooling members 21 and 22 thus does not additionally load the entire heat management of the cooling arrangement K. Therefore, the cooling members 21 and 22 can as well as used as a shunt, when the material and the dimensions of the cooling members 21 and 22 result in an appropriately defined electric resistance.

The heat conducting material 11 and the further heat conducting material 12 (wherein both heat conducting materials can be equal or different) are used, for example, in the form of a pre-fabricated mat or pad, as already described before in conjunction with the heat conducting material 11. Furthermore potting is possible, wherein the appropriate heat conducting material is selectively introduced to the respective position (i.e. in the respective space in the casing 3). Potting is performed for at least parts of the spaces or for the entire space. In the case of different heat conducting materials 11 or 12 plural potting operations can be carried out.

The present invention was described in detail by way of embodiments with reference to the drawings. However, the invention is not fixed to the specifications of the present description and especially to the dimensions given in the Figures. The invention comprises all subject matters covered by the enclosed claims.

What is claimed is:

1. A cooling device for heat-emitting components, wherein at least one component is arranged on a printed circuit board, comprising
    first and second cooling members,
    wherein the two cooling members are arranged on the printed circuit board adjacent to and at a predetermined distance from the at least one component on opposite sides of the component,
    wherein the cooling members include segments which are arranged in parallel to each of the respective sides of the at least one component and extend away from the printed circuit board, and
    wherein on the at least one component a cooling unit is arranged and the cooling unit includes a contact area resting on the at least one component for making thermal contact, and wherein the cooling members of the cooling device extend away from the printed circuit board at a height that exceeds a height of the at least one component adjacent to the contact area and are spaced apart from the latter.

2. The cooling device according to claim 1, wherein in a space between the respective cooling member and the contact area of the cooling unit a heat conducting material is introduced for forming a thermal coupling between the respective cooling member and the contact area of the cooling unit.

3. The cooling device according to claim 2, wherein, in the case of plural components, the cooling members are arranged adjacent to each component and a segment of the respective cooling member is arranged adjacent to each component.

4. The cooling device according to claim 3, wherein the plural components are arranged in a straight line or in any curved line and the cooling members of the cooling device follow the course of the arrangement of the plural components, wherein a segment of the respective cooling member is arranged adjacent to each component on different sides thereof.

5. A cooling arrangement for cooling at least one heat-emitting component arranged on a printed circuit board, comprising
    a cooling unit in the form of a casing comprising a heat sink and a cover, wherein
    in an assembled condition of the casing the printed circuit board is arranged with the at least one component between the heat sink and the cover and the heat sink includes a contact area resting on the at least one component for making a thermal contact, and in the area of the at least one component the cover has a projecting portion which contacts the printed circuit board on the side of the printed circuit board facing away from the at least one component, and
    a cooling device comprising
    first and second cooling members,
    wherein the two cooling members are arranged on the printed circuit board adjacent to and at a predetermined distance from the at least one component on opposite sides of the component.

6. The cooling arrangement according to claim 5, wherein, in the case of plural components, the contact area of the heat sink and the projecting portion of the cover in each case follow the arrangement of the components on the printed circuit board, the contact area of the heat sink contacting at least some or all components.

7. The cooling arrangement according to claim 6, wherein the cooling members of the cooling device extend away from the printed circuit board and extend to be laterally adjacent to and at a predetermined distance from the contact area of the heat sink, and wherein the space between the heat sink and the cover completely or at least partially includes a heat conducting material.

8. The cooling arrangement according to claim 7, wherein the cooling members of the cooling device are mechanically and electrically connected to the printed circuit board and serve as electric conductors.

9. The cooling arrangement according to claim 5, wherein the cooling members of the cooling device extend away from the printed circuit board and extend to be laterally adjacent to and at a predetermined distance from the contact area of the heat sink, and wherein the space between the heat sink and the cover completely or at least partially includes a heat conducting material.

10. The cooling arrangement according to claim 5, wherein the cooling members of the cooling device are mechanically and electrically connected to the printed circuit board and serve as electric conductors.

* * * * *